US007738983B2

(12) United States Patent
Yamaji et al.

(10) Patent No.: US 7,738,983 B2
(45) Date of Patent: Jun. 15, 2010

(54) METHOD OF OPTIMIZING PROCESS RECIPE OF SUBSTRATE PROCESSING SYSTEM

(75) Inventors: Kaname Yamaji, Sapporo (JP); Kiyoshi Suzuki, Oshu (JP); Yuichi Takenaga, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 173 days.

(21) Appl. No.: 11/905,842

(22) Filed: Oct. 4, 2007

(65) Prior Publication Data

US 2008/0086228 A1 Apr. 10, 2008

(30) Foreign Application Priority Data

Oct. 5, 2006 (JP) ............................ 2006-273887

(51) Int. Cl.
*G06F 19/00* (2006.01)
(52) U.S. Cl. ......................... 700/100; 700/28; 700/109; 700/121
(58) Field of Classification Search ................. 700/28, 700/29, 31, 100, 103, 105, 108–110, 121; 702/81–84, 97, 170, 182–184; 438/14, 16
See application file for complete search history.

(56) References Cited

U.S. PATENT DOCUMENTS

| 6,269,279 | B1 * | 7/2001 | Todate et al. ................. 700/121 |
| 6,524,449 | B1 * | 2/2003 | Folta et al. ............. 204/192.13 |
| 6,668,207 | B1 * | 12/2003 | Montcalm et al. ........... 700/121 |
| 6,913,938 | B2 * | 7/2005 | Shanmugasundram et al. ... 438/16 |
| 7,160,739 | B2 * | 1/2007 | Shanmugasundram et al. ... 438/14 |

(Continued)

FOREIGN PATENT DOCUMENTS

JP 2001-217233 8/2001

(Continued)

OTHER PUBLICATIONS

European Search Report ( Application No. EP 07 01 9459).

*Primary Examiner*—Charles R Kasenge
(74) *Attorney, Agent, or Firm*—Smith, Gambrell & Russell, LLP

(57) ABSTRACT

The present invention is a method of optimizing a process recipe of a substrate processing system including: a substrate processing apparatus that performs a film deposition process of a substrate to be processed according to a process recipe; a data processing unit that executes a calculation for optimizing the process recipe; and a host computer; the substrate processing apparatus, the data processing unit, and the host computer being connected to each other through a network. The present invention includes the steps of: measuring a film thickness of a substrate to be processed that has been subjected to a film deposition process by the substrate processing apparatus; sending a command for conducting a process-recipe optimizing process from the host computer to the substrate processing apparatus, when the measured film thickness is deviated from a target film thickness and the deviation is beyond an allowable range; and in response to the command for conducing a process-recipe optimizing process from the host computer, sending required data from the substrate processing apparatus to the data processing unit, causing the data processing unit to execute a process-recipe optimizing calculation to calculate an optimum process recipe for achievement of the target film thickness, and updating the process recipe in the substrate processing apparatus based on the calculated result.

5 Claims, 8 Drawing Sheets

U.S. PATENT DOCUMENTS

2002/0055804 A1 5/2002 Betawar et al.
2004/0267399 A1 12/2004 Funk
2005/0087298 A1 4/2005 Tanaka et al.
2006/0235558 A1* 10/2006 Tanaka ...................... 700/108

FOREIGN PATENT DOCUMENTS

| JP | 2002-43300 | 2/2002 |
|----|------------|--------|
| JP | 2003-217995 | 7/2003 |
| JP | 2004-319574 | 11/2004 |

* cited by examiner

METHOD OF OPTIMIZING PROCESS RECIPE OF SUBSTRATE PROCESSING SYSTEM

FIELD OF THE INVENTION

The present invention relates to a method of optimizing a process recipe of a substrate processing system.

BACKGROUND ART

When a semiconductor device is manufactured, various substrate processing apparatuses are used for subjecting a substrate to be processed, such as a semiconductor wafer (hereinafter also referred to simply as "wafer"), to a film-deposition process, a diffusion process, an annealing process, an etching process, and so on. Given as an example of such a substrate processing apparatus is a heat processing apparatus that heat-processes a wafer to deposit thereon a thin film such as an oxide film. For example, in a vertical heat processing apparatus including a vertical heat processing furnace, a holder called "wafer boat" holding a number of wafers in a tier-like manner is loaded into the heat processing furnace, and a film deposition process is performed therein.

The film deposition process of a wafer is performed according to a process recipe (set values of process parameters) including various process conditions such as a set pressure, a set temperature of a heater, a gas flowrate, and so on, in accordance with a kind of thin film to be deposited and a thickness thereof, for example. The process recipe is optimized by repeating the following operation. That is to say, a film deposition process is performed for adjustment wafers (dummy wafers) placed in a wafer boat, and the process recipe is adjusted based on a process result.

More specifically, the process-recipe optimizing process includes the steps of: measuring a thickness of a thin film deposited on a wafer by a film-thickness measuring apparatus, importing the film-thickness data into a heat processing apparatus, by an operator, through a storage medium such as a flexible disc, or automatically sending the film-thickness data to the heat processing apparatus; and calculating a process recipe such that a deviation between the measured film-thickness data and a target film thickness is resolved (see, for example, JP2001-217233A and JP2002-43300A).

However, a substrate processing apparatus such as a heat processing apparatus has to bear a heavy calculating load, when the apparatus itself performs a data computing operation for optimizing a process recipe. This invites deterioration of throughput in processing wafers in the substrate processing apparatus. In order to cope with the problem, there has been conventionally provided a data processing unit for this computing operation (e.g., advanced group controller) which is separated from the substrate processing apparatus. By connecting the data processing unit and the substrate processing apparatus through a network, all the required data are sent from the substrate processing apparatus to the data processing unit, so that the data processing unit conducts the calculation for optimizing a process recipe (see, for example, JP2003-217995).

SUMMARY OF THE INVENTION

Recently, in manufacturing a semiconductor device, a host computer controls the whole production. Thus, it is desirable that the host computer manages, for example, a target value of a process of a wafer (e.g., a target film thickness of a thin film to be formed on a wafer), and that, when an actual process result is deviated from the target value, the calculation for optimizing the process recipe is executed based on a command from the host computer.

However, a target value of a film thickness or the like has been conventionally controlled by a substrate processing apparatus. Thus, the calculation for optimizing the process recipe has been executed based on a command from the substrate processing apparatus. Namely, it has been impossible to conduct a process for optimizing a process recipe based on a command from the host computer.

With respect to this point, an invention is known in which a host computer receives film-thickness data and process-condition data to execute an optimizing calculation so as to optimize a process recipe (see, for example, JP2004-319574A). However, when the host computer takes charge of all the processes including the calculation for optimizing the wafer processing conditions, a load on the host computer is increased to degrade throughput of the overall factory.

The present invention has been made in view of the above circumstances. The object of the present invention is to provide a method of optimizing a process recipe of a substrate processing system, in which a substrate processing apparatus causes, in response to a command from a host computer, a data processing unit to execute a calculation for optimizing a process recipe.

The present invention is a method of optimizing a process recipe of a substrate processing system, the substrate processing system including: a substrate processing apparatus that performs a film deposition process of a substrate to be processed according to a process recipe; a data processing unit that executes a calculation for optimizing the process recipe; and a host computer; the substrate processing apparatus, the data processing unit, and the host computer being connected to each other through a network; the method comprising the steps of: measuring a film thickness of a substrate to be processed that has been subjected to a film deposition process by the substrate processing apparatus; sending a command for conducting a process-recipe optimizing process from the host computer to the substrate processing apparatus, when the measured film thickness is deviated from a target film thickness and the deviation is beyond an allowable range; and in response to the command for conducting a process-recipe optimizing process from the host computer, sending required data from the substrate processing apparatus to the data processing unit, causing the data processing unit to execute a process-recipe optimizing calculation to calculate an optimum process recipe for achievement of the target film thickness, and updating the process recipe in the substrate processing apparatus based on the calculated result.

According to the process-recipe optimizing process in this embodiment, the heat processing apparatus receives a command from the host compute, and causes the data processing unit to execute the optimizing calculation of the process recipe. Thus, the process-recipe optimizing process can be performed in response to a command from the host computer. Thus, the host computer can manage a target value (e.g., a target film thickness) of the wafer process. Therefore, whether to perform the process-recipe optimizing process or not can be judged by the host computer. Accordingly, the host computer can freely set and control any condition, e.g., degree of deviation from the target value, for conducting the process-recipe optimizing process. According to the present invention, the process recipe can be automatically optimized by a command from the host computer.

Moreover, the process recipe obtained by the optimizing calculation can be promptly updated by the heat processing apparatus, and there is no necessity for the heat processing apparatus to send the process recipe to the host computer and wait a next command therefrom. Since the process-recipe optimizing process can be terminated at this moment, it can be prevented that the heat processing apparatus awaiting a command from the host computer 500 becomes busy at the process-recipe optimizing process and thus the heat processing apparatus cannot start another process.

Preferably, the method of the present invention may further include the steps of: when the process recipe is updated, sending the updated process recipe from the substrate processing apparatus to the host computer; and judging whether the updated process recipe is acceptable or not, by the host computer.

In this case, the host computer can judge whether the updated process recipe is acceptable or not, before the host computer sends, to the substrate processing apparatus, a next command for conducting a process of a substrate to be processed. At the same time, it can be prevented that, when a process recipe automatically obtained by the process-recipe optimizing calculation is unacceptable, such a process recipe is used for processing a next substrate to be processed.

More preferably, when the updated process recipe is judged to be acceptable by the host computer, a next command for processing a substrate may be sent to the substrate processing apparatus, and when the updated process recipe is judged to be unacceptable by the host computer, a command for restoring the process recipe may be sent to the substrate processing apparatus to return the process recipe to the pre-updated process recipe. Thus, after a film deposition process of a substrate to be processed is performed according to the process recipe before updated, the calculation for optimizing the process recipe can be executed again.

In addition, preferably, the step of measuring a film thickness of the substrate to be processed may be performed by a film-thickness measuring apparatus connected to the host computer. Alternatively, preferably, the step of measuring a film thickness of the substrate to be processed may be performed by a film-thickness measuring apparatus connected to the substrate processing system.

In addition, the present invention is a method of optimizing a process recipe of a substrate processing system, the substrate processing system including: a substrate processing apparatus that performs a process of a substrate to be processed according to a process recipe; a data processing unit that executes a calculation for optimizing the process recipe; and a host computer; the substrate processing apparatus, the data processing unit, and the host computer being connected to each other through a network; the method comprising the steps of: sending a command for conducting a process-recipe optimizing process from the host computer to the substrate processing apparatus, when a predetermined condition is satisfied; in response to the command for conducting a process-recipe optimizing process from the host computer, sending required data from the substrate processing apparatus to the data processing unit, causing the data processing unit to execute a process-recipe optimizing calculation to calculate an optimum process recipe, and updating the process recipe in the substrate processing apparatus based on the calculated result.

According to the present invention it is possible to perform the process-recipe optimizing process in response to a command from the host computer.

Preferably, the method of the present invention may further include when the process recipe is updated, sending the updated process recipe from the substrate processing apparatus to the host computer; and judging whether the updated process recipe is acceptable or not, by the host computer.

In this case, it is preferable that when the updated process recipe is judged to be acceptable by the host computer, a next command for processing a substrate is sent to the substrate processing apparatus, and that when the updated process recipe is judged to be unacceptable by the host computer, a command for restoring the process recipe is sent to the substrate processing apparatus to return the process recipe to the pre-updated process recipe. Namely, it is preferable that the substrate processing apparatus updates the process recipe and terminates the process-recipe optimizing process at this moment, and thereafter, the substrate processing apparatus performs a process in response to a command from the host computer. Thus, it can be prevented that the heat processing apparatus awaiting a command from the host computer becomes busy at the process-recipe optimizing process and thus the heat processing apparatus cannot start another process.

In addition, the present invention is a substrate processing system comprising: a substrate processing apparatus that performs a process of a substrate to be processed according to a process recipe; a data processing unit that executes a calculation for optimizing the process recipe; and a host computer; the substrate processing apparatus, the data processing unit, and the host computer being connected to each other through a network; wherein the host computer is configured to acquire process data of a substrate to be processed that has been processed by the substrate processing apparatus, to judge whether a process recipe is to be optimized or not based on the process data, and to send a command for conducting a process-recipe optimizing process to the substrate processing apparatus when the process recipe is judged to be optimized; and upon receipt of the command for conducting a process-recipe optimizing process from the host computer, the substrate processing apparatus is configured to send required data to the data processing unit, to make the data processing unit execute the process-recipe optimizing calculation to calculate an optimum process recipe, and to update the process recipe based on the calculated result.

According to the present invention, it is possible to perform the process-recipe optimizing process in response to a command from the host computer.

Preferably, the substrate processing apparatus may be configured to send the updated process recipe to the host computer, when the process recipe is updated, and upon receipt of the updated process recipe from the substrate processing apparatus, the host computer may be configured to judge whether the updated process recipe is acceptable or not, before sending a next command for processing a substrate to be processed to the substrate processing apparatus.

In this case, the host computer can judge whether the updated process recipe is acceptable or not, before the host computer sends, to the substrate processing apparatus, a next command for conducting a process of a substrate to be processed. At the same time, it can be prevented that, when a process recipe automatically obtained by the process-recipe optimizing calculation is unacceptable, such a process recipe is used for processing a next substrate to be processed.

Further, it is preferable that, when the updated process recipe is judged to be acceptable, the host computer is configured to send the next command for processing a substrate to be processed to the substrate processing apparatus, and, when the updated process recipe is judged to be unacceptable, the host computer is configured to send a command for restoring the process recipe to the substrate processing apparatus to return the process recipe to the pre-updated process recipe.

In this case, after a film deposition process of a substrate to be processed is performed according to the process recipe before updated, the calculation for optimizing the process recipe can be executed again.

In addition, the present invention is a substrate processing system comprising: a plurality of substrate processing apparatuses, each of which performs a process of a substrate to be processed according to a process recipe; a data processing unit that executes a calculation for optimizing the process recipe; and a host computer; the substrate processing apparatuses, the data processing unit, and the host computer being connected to each other through a network; wherein the host computer is configured to acquire process data of a substrate to be processed that has been processed by each of the substrate processing apparatuses, to judge whether a process recipe is to be optimized or not based on the process data, and to send a command for conducting a process-recipe optimizing process to the substrate processing apparatus when the process recipe is judged to be optimized; and upon receipt of the command for conducting a process-recipe optimizing process from the host computer, the substrate processing apparatus is configured to send required data to the data processing unit, to make the data processing unit execute the process-recipe optimizing calculation to calculate an optimum process recipe, and to update the process recipe based on the calculated result.

According to the present invention, the respective substrate processing apparatuses can receive a command from the host computer, and cause the data processing unit to execute the optimizing calculation of a process recipe. According to this, the process-recipe optimizing processes for the respective substrate processing apparatuses can be performed in response to a command from the host computer. Thus, a target value (e.g., a target film thickness) of a wafer process performed by each of the respective substrate processing apparatuses can be managed by the host computer in a unitary manner. Therefore, whether to execute the process-recipe optimizing process or not can also be collectively judged by the host computer.

In addition, the present invention is a substrate processing apparatus that performs a process of a substrate to be processed according to a process recipe, wherein the substrate processing apparatus is configured to be connectable with a data processing unit that executes a calculation for optimizing the process recipe and a host computer through a network, and in response to a command for conducting a process-recipe optimizing process from the host computer, the substrate processing apparatus is configured to send required data to the data processing unit, to make the data processing unit execute a process-recipe optimizing calculation to calculate an optimum process recipe, and to update the process recipe based on the calculated result.

According to the present invention, it is possible to perform the process-recipe optimizing process in response to a command from the host computer.

BEST MODE FOR CARRYING OUT THE INVENTION

A preferred embodiment of the present invention will be described in detail below with reference to the accompanying drawings. In the specification and the drawings, the structural elements having substantially the same function and structure are shown by the same reference numbers, and the overlapped description is omitted.

(Structural Example of Substrate Processing Apparatus)

Figure 1:
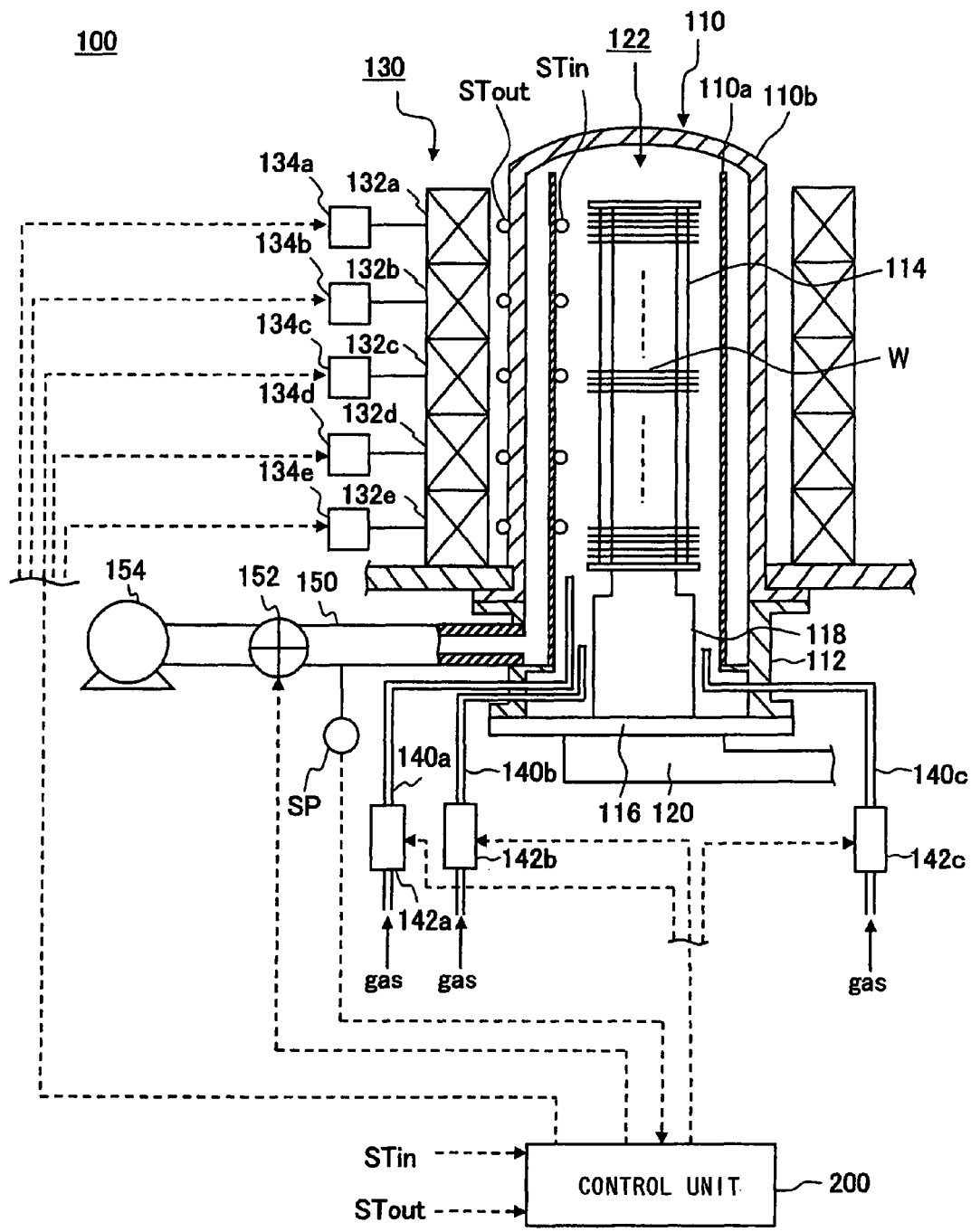
FIG. 1 is a sectional view showing a structural example of a heat processing apparatus in one embodiment of the present invention.

At first, there is described a substrate processing apparatus applied to a substrate processing system in one embodiment of the present invention. Herein, the substrate processing apparatus is structured as a vertical heat processing apparatus of a batch type (hereinafter referred to simply as "heat processing apparatus") which is capable of simultaneously heat-processing a number of substrates to be processed, such as semiconductor wafers (hereinafter also referred to simply as "wafers"). FIG. 1 is a sectional view showing a structural example of the heat processing apparatus.

As shown in FIG. 1, the heat processing apparatus 100 includes a process chamber 122 in which a wafer W is subjected to a heat process. The process chamber 122 is mainly composed of a reaction tube 110 and a manifold 112. The reaction tube 110 is of a duplex-tube structure including an inner tube 110a and an outer tube 110b. The metallic cylindrical manifold 112 is disposed on an underside of the reaction tube 110. An upper end of the inner tube 110a is opened, while a lower end thereof is supported by the manifold 112. The outer tube 110b has a covered upper end, and a lower end that is air-tightly joined to an upper end of the manifold 112.

In the reaction tube 110, a wafer boat 114 serving as a wafer holder holds a number of (e.g., 150) wafers W horizontally with vertical predetermined intervals therebetween in a tier-like manner. The wafer boat 114 is held on a lid member 116 via a heat retention tube (heat insulation member) 118.

The lid member 116 is placed on a boat elevator 120 for loading the wafer boat 114 into the reaction tube 110 and unloading the wafer boat 114 from the reaction tube 110. At an upper limit position, the lid member 116 has a function of closing a lower opening of the process chamber 122 formed by the reaction tube 110 and the manifold 112.

Wafers W accommodated in a cassette container, not shown, are transferred to the wafer boat 114 by a transfer apparatus, not shown. The wafer boat 114 is loaded into the reaction tube 110 by the boat elevator 120, and the wafers W are then processed. Thereafter, when processing of the wafers W is finished, the wafer boat 114 is unladed from the reaction tube 110 by the boat elevator 120, and the wafers W on the wafer boat 114 are returned to the cassette container by the transfer apparatus.

A heater 130 of, e.g., a resistor, is disposed around the reaction tube 110. The heater 130 is formed of heater units 132a to 132e which are laid at five levels, for example. Electric power is independently supplied to the respective heater units 132a to 132e from respective power controllers 134a to 134e.

Disposed on an inner surface of the inner tube 110a are a plurality of, e.g., five inside temperature sensors STins which are vertically arranged in a line. The inside temperature sensor STin is covered by, e.g., a quartz pipe for preventing metal contamination of wafers W. Similarly, disposed on an outer surface of the inner tube 110b are a plurality of, e.g., five outside temperature sensors STouts which are vertically arranged in a line. The inside temperature sensors STins and the outside temperature sensors STouts are formed of, for example, thermocouples.

To the manifold 112, there are connected a plurality of gas supply pipes for supplying dichlorosilane, ammonia, a nitrogen gas, an oxygen gas, or the like. In FIG. 1, three gas supply pipes 140a to 140c are illustrated for facilitating understanding. Flowrate adjusting parts 142a to 142c, such as massflow controllers (MFC), for adjusting gas flowrates, are disposed in the respective gas supply pipes 140a to 140c.

Further, to the manifold 112, there is connected an exhaust pipe 150 for exhausting the reaction tube 110 through a gap between the inner tube 110a and the outer tube 110b. The exhaust pipe 150 is connected to a vacuum pump 154 via a pressure adjusting part 152 for adjusting a pressure in the reaction tube 110, including a combination valve, a butterfly valve, a valve driving part, or the like.

Furthermore, in the exhaust pipe 150, there is disposed a pressure sensor SP that detects a pressure in the process chamber 122, and that feedback-controls the pressure adjusting part 152. As the pressure sensor SP, it is preferable to use an absolute-pressure type sensor which is resistant to a change in an outside pressure. However, a differential-pressure type sensor may be used.

The heat processing apparatus 100 includes a control unit 200 for controlling the heat processing apparatus 100, based on process recipe data formed of process conditions such as a set pressure, a set temperature for the heater, a gas flowrate, and the like, in accordance with a kind of thin film to be deposited and a thickness thereof. The control unit 200 imports thereinto temperature detecting signals from the inside temperature sensors STin and the outside temperature sensor STouts, and a pressure detecting signal from the pressure sensor SP. Based on these detecting signals, the control unit 200 controls the power controllers 134a to 134e of the heater 130, the pressure adjusting part 152, the flowrate adjusting parts 142a to 142c, and so on.

Figure 2:
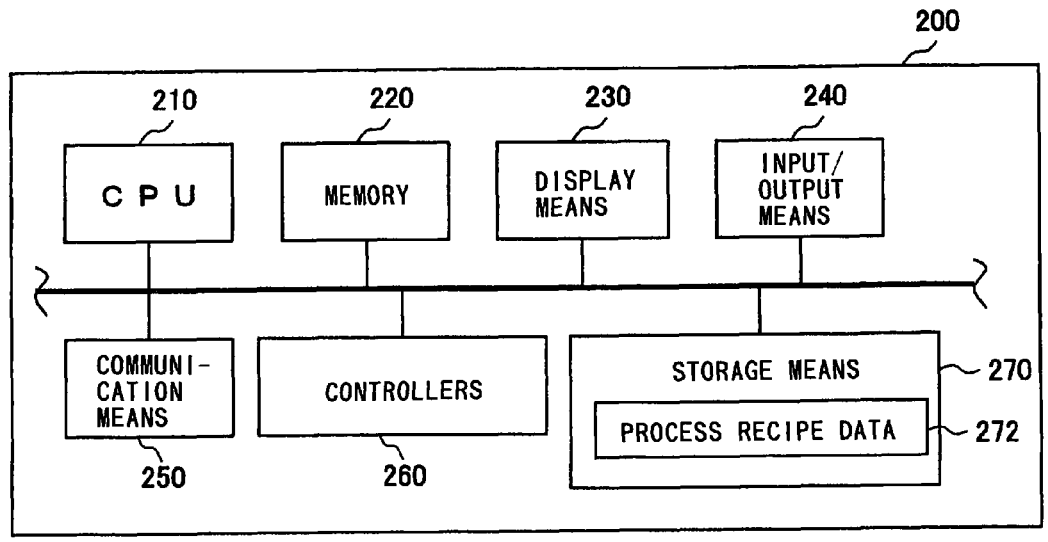
FIG. 2 is a block diagram showing a structural example of a control unit shown in FIG. 1.

As shown in FIG. 2, for example, the control unit 200 includes: a CPU (central processing unit) 210; a memory 220 used for various processes executed by the CPU 210; display means 230 formed of a liquid-crystal display device and the like for displaying an operation window, a selection window, and the like; input/output means 240 formed of an operation panel, a keyboard, and the like for various operations performed by an operator, such as inputting of various data and outputting of various data to a predetermined storage medium; and communication means 250 for communicating data through a network or the like.

In addition thereto, the control unit 200 includes various controllers 260 for controlling respective parts of the heat processing apparatus 100, and storage means 270 formed of a hard disc (HDD) or the like storing various programs executed by the CPU 210 and data required for executing the programs. The CPU 210 reads the programs and the data from the storage means 270 to use the same, according to need.

As the various controllers 260, there are, for example, a temperature controller that controls the power controllers 134a to 134e to control the heater 130, and a pressure controller that controls a pressure in the reaction tube 110. Both controllers can operate in response to a command from the heat processing apparatus 100.

The storage means 270 stores process recipe data (process condition data) 272 formed of process recipes, each of which includes process conditions, such as a set pressure, a set temperature for the heater, a gas flowrate, and so on, which are prepared for each kind of thin film to be deposited and a thickness thereof. For example, in accordance with a kind of thin film to be deposited and a thickness thereof, the heat processing apparatus 100 reads a corresponding process recipe from the process recipe data 272, and performs a film deposition process of a wafer W according to the process recipe.

(Structural Example of Substrate Processing System)

Figure 3:
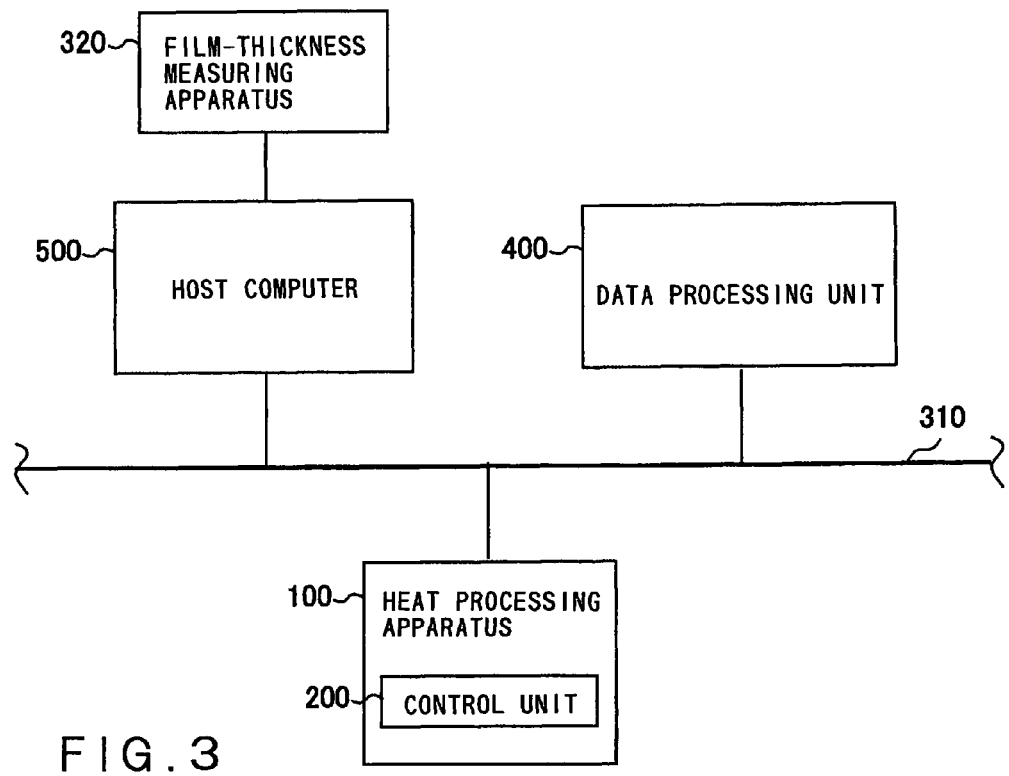
FIG. 3 is a block diagram of a structural example of a substrate processing system in this embodiment.

Next, a substrate processing system in this embodiment will be described. FIG. 3 is a block diagram showing a schematic structure of a substrate processing system in this embodiment. As shown in FIG. 3, the substrate processing system 300 includes the heat processing apparatus 100, a data processing unit 400, and a host computer 500, which are connected to each other through a network 310 such as a LAN (Local Area Network), for example. Data communication by the network 310 is performed based on a communication protocol such as a TCP/IP.

Figure 4:
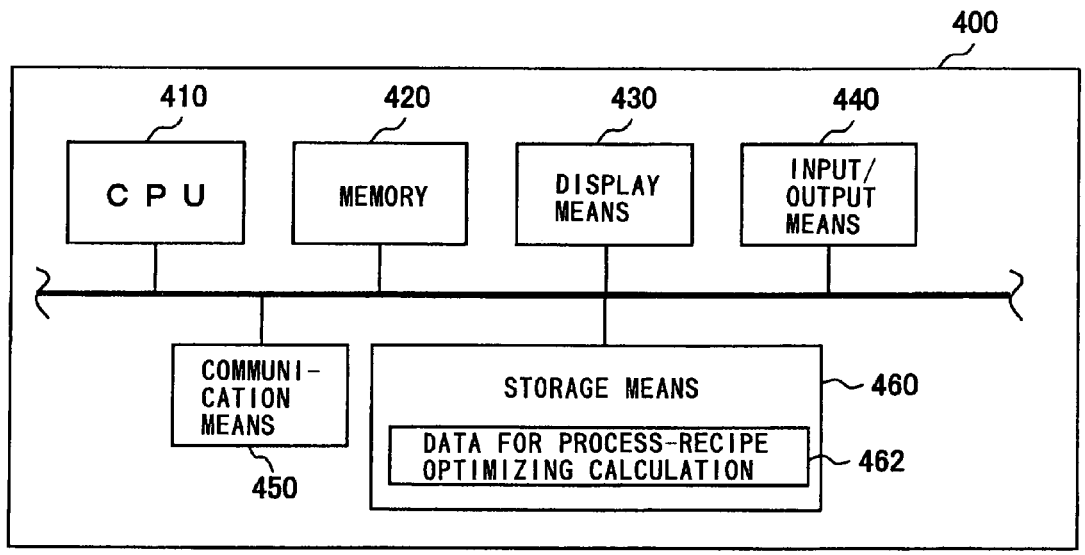
FIG. 4 is a block diagram showing a structural example of a data processing unit in this embodiment.

As shown in FIG. 4, for example, the data processing unit 400 includes: a CPU (central processing unit) 410; a memory 420 used for various data processes executed by the CPU 410; display means 430 formed of a liquid-crystal display device or the like for displaying an operation window and/or a selection window; input/output means 440 formed of an operation panel, a keyboard, and the like for various operations performed by an operator, such as inputting of various data and outputting of various data to a predetermined storage medium; communication means 450 for communicating data with, e.g., the heat processing apparatus 100 through the network 310; and storage means 460 such as a hard disc (HDD) or the like storing various programs executed by the CPU 410 and data required for executing the programs. The CPU 410 reads the programs and the data from the storage means 460 to use the same, according to need. Such a data processing unit 400 is formed of a computer, for example.

The storage means 460 stores process-recipe optimizing calculation data 462 for calculating an optimum process recipe based on film-thickness data and process recipe data (e.g., temperature recipe data stating set temperatures of the heater 130). As the process-recipe optimizing calculation data, when process recipe data is temperature recipe data, for example, there is stored a film-thickness/temperature coefficient indicating a relationship between temperatures and film thicknesses (for example, a coefficient indicating a change in a film thickness when a temperature is changed by 1° C.).

Figure 5:
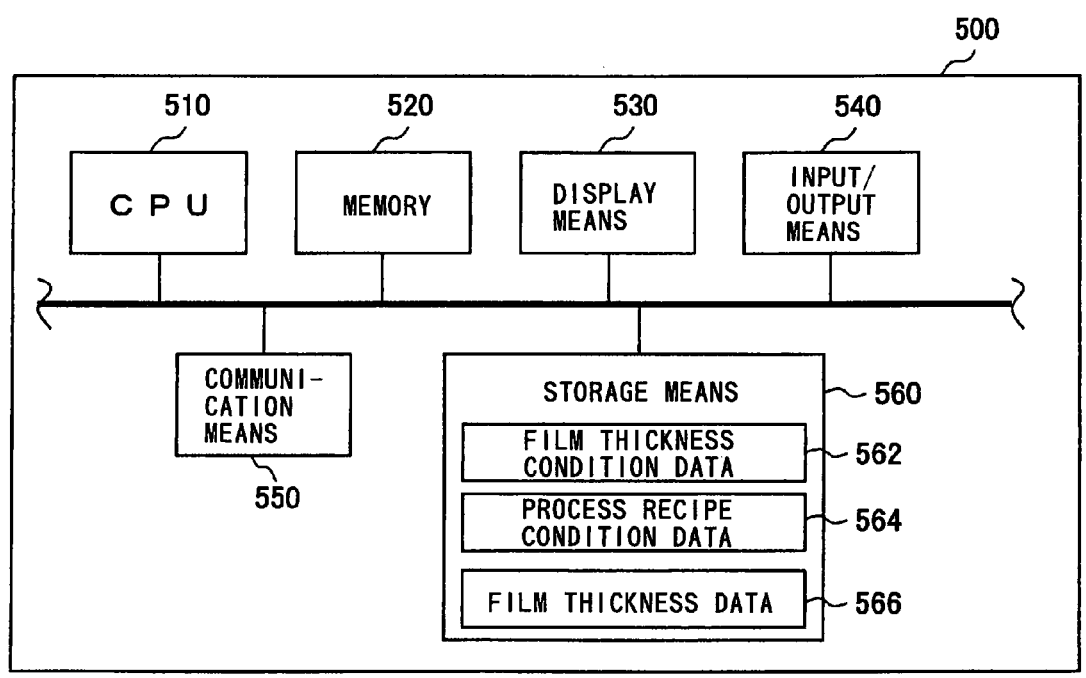
FIG. 5 is a block diagram of a structural example of a host computer shown in FIG. 4.

As shown in FIG. 5, the host computer 500 includes: a CPU (central processing unit) 510; a memory 520 used for various data processes executed by the CPU 510; display means 530 formed of a liquid-crystal display device or the like for displaying an operation window and/or a selection window;

input/output means 540 formed of an operation panel, a keyboard, and the like for various operations performed by an operator, such as inputting of various data and outputting of various data to a predetermined storage medium; and communication means 550 for communicating data with, e.g., the heat processing apparatus 100 through the network 310.

The communication means 550 is connected to the communication means 250 in the control unit 200 of the heat processing apparatus 100 through the network 310. The communication means 250 of the heat processing apparatus 100 has logical interface means, such as an HCI (Host Communication Interface) for the host computer 500, for example. Various data are communicated between the heat processing apparatus 100 and the host computer 500 by the HCI based on a protocol such as a TCP/IP. The structure of the communication means 250 is not limited to the above one.

In addition, the host computer 500 includes, for example, storage means 560 formed of a hard disc (HDD) or the like storing various programs executed by the CPU 510 and data required for executing the programs. The CPU 510 reads the programs and the data from the storage means 560 to use the same, according to need.

The storage means 560 stores film-thickness condition data 562 stating previously set film thickness conditions such as a target film thickness and an allowable range thereof, process recipe condition data 564 stating an allowable range of a process recipe (for example, an allowable range of a temperature, when the process recipe is a temperature recipe), and a film thickness data 566 received from a film-thickness measuring apparatus 320 which is described below.

Connected to the host computer 500 is the film-thickness measuring apparatus 320 that measures a thickness of a film on a wafer that has, been processed by the heat processing apparatus 100. The film-thickness measuring apparatus 320 is structured to use an ellipsometer to measure a thickness of a thin film on a surface of a wafer placed on a table disposed in the film-thickness measuring apparatus 320. The ellipsometer is an optical interference thicknessmeter including an epi-illumination type microscope, a spectrograph, and a data processing part. Light is irradiated from a light source to a wafer via an objective lens, and the light reflected by the wafer enters the spectrograph. By analyzing a reflection spectrum of the incident light, a film thickness is calculated. In response to a command from the host computer 500, the film-thickness measuring apparatus 320 measures a thickness of a thin film formed on a wafer, and sends the measured film thickness as film thickness data to the host computer 500.

As shown in FIG. 3, the film-thickness measuring apparatus in this embodiment is connected to the host computer 500. However, not limited thereto, the film-thickness measuring apparatus may be connected to the heat processing apparatus 100. In this case, film thickness data sent from the film-thickness measuring apparatus may be imported into the heat processing apparatus 100 at first, and the data may be then sent therefrom to the host computer 500 through the network 310.

(Process of Wafer and Process-recipe Optimizing Process)

Next, a process of a wafer and a process-recipe optimizing process in the substrate processing system 300 will be described with reference to the drawings. After the process of a wafer is finished, the process-recipe optimizing process is conducted according to need, based on a judgment of the host computer 500. To be specific, the process of a wafer and the process-recipe optimizing process are performed, as shown in flowcharts of FIGS. 6 to 10, for example, by means of controls of the host computer 500, the heat processing apparatus 100, and the data processing unit 400 according to predetermined programs, and by means of data communication therebetween.

Figure 6:
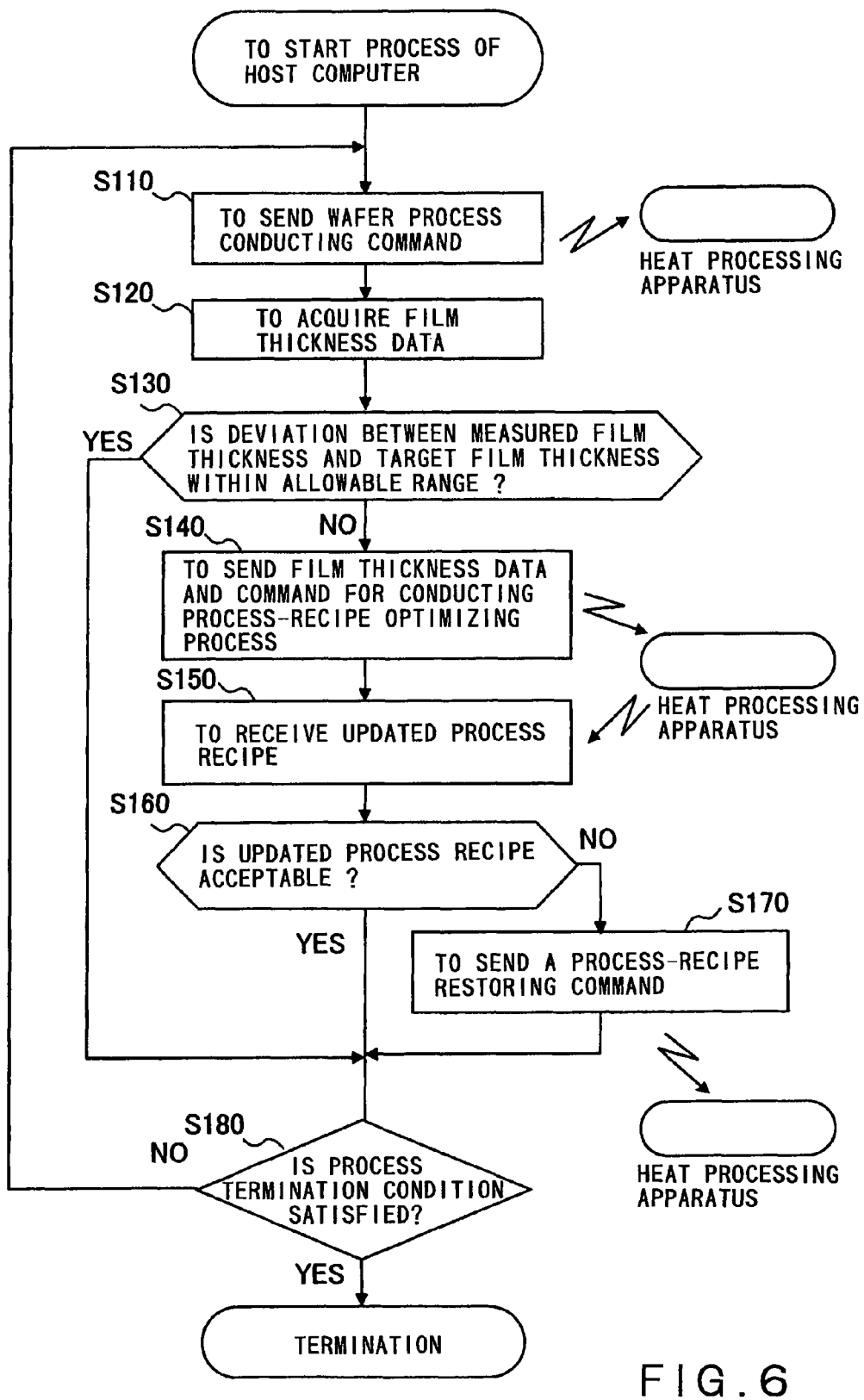
FIG. 6 is a flowchart showing a concrete example of a process executed by the host computer in this embodiment.
Figure 7:
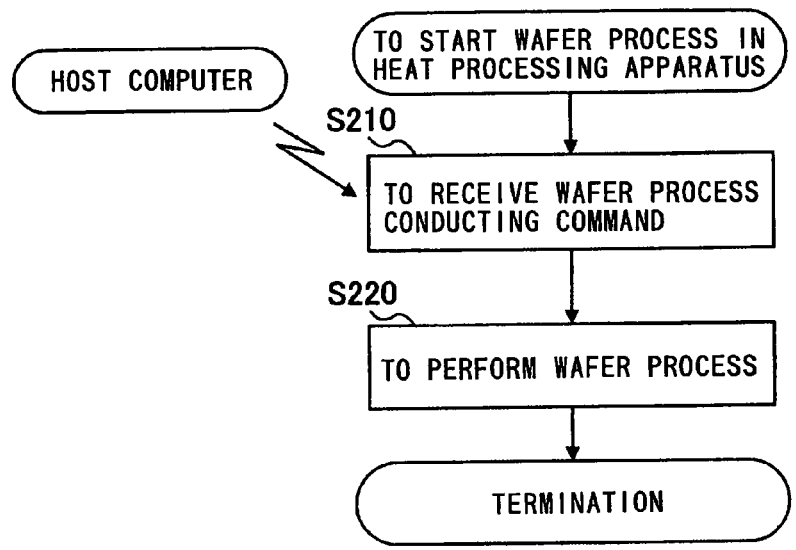
FIG. 7 is a flowchart showing a concrete example of a wafer process performed by the heat processing apparatus in this embodiment.
Figure 8:
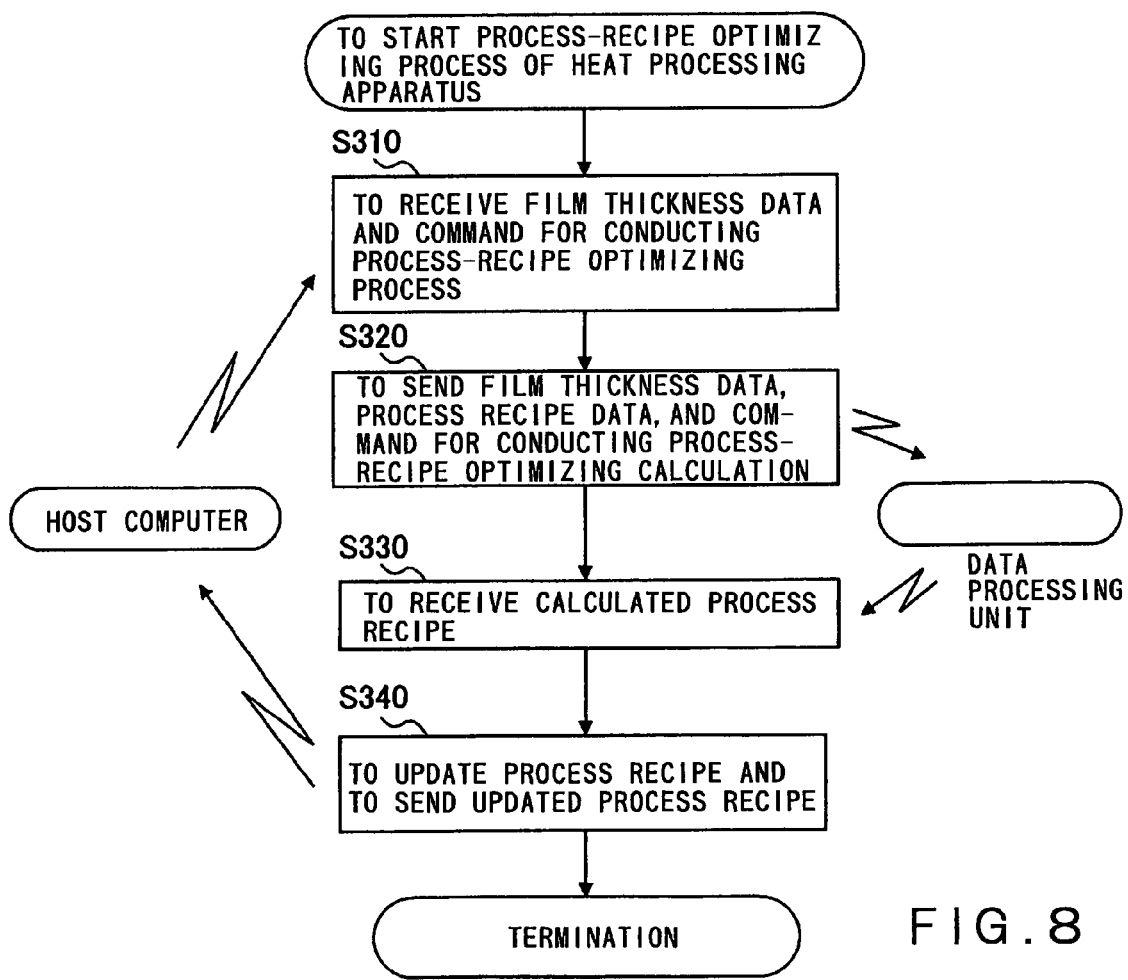
FIG. 8 is a flowchart showing a concrete example of a process-recipe optimizing process executed by the heat processing apparatus in this embodiment.
Figure 9:
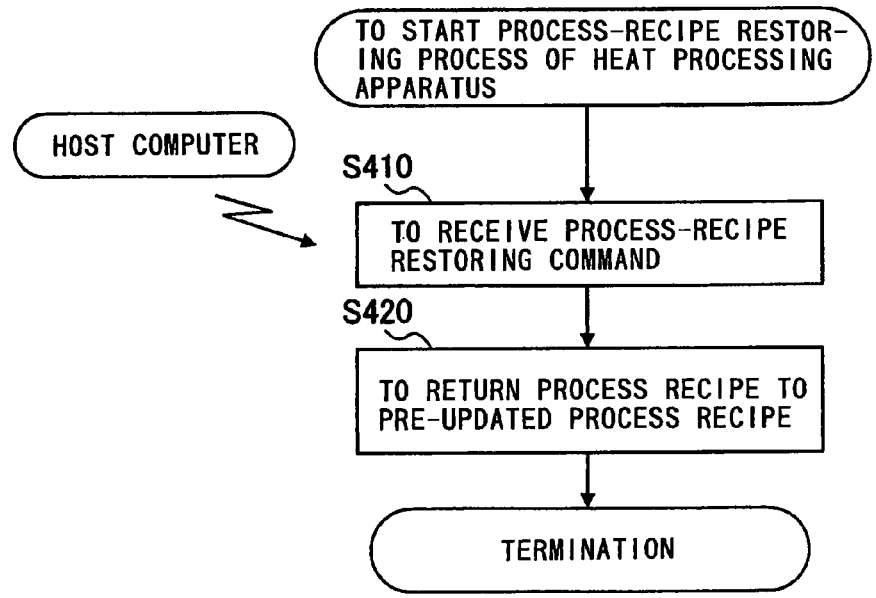
FIG. 9 is a flowchart showing a concrete example of a process-recipe restoring process executed by the heat processing apparatus in this embodiment.
Figure 10:
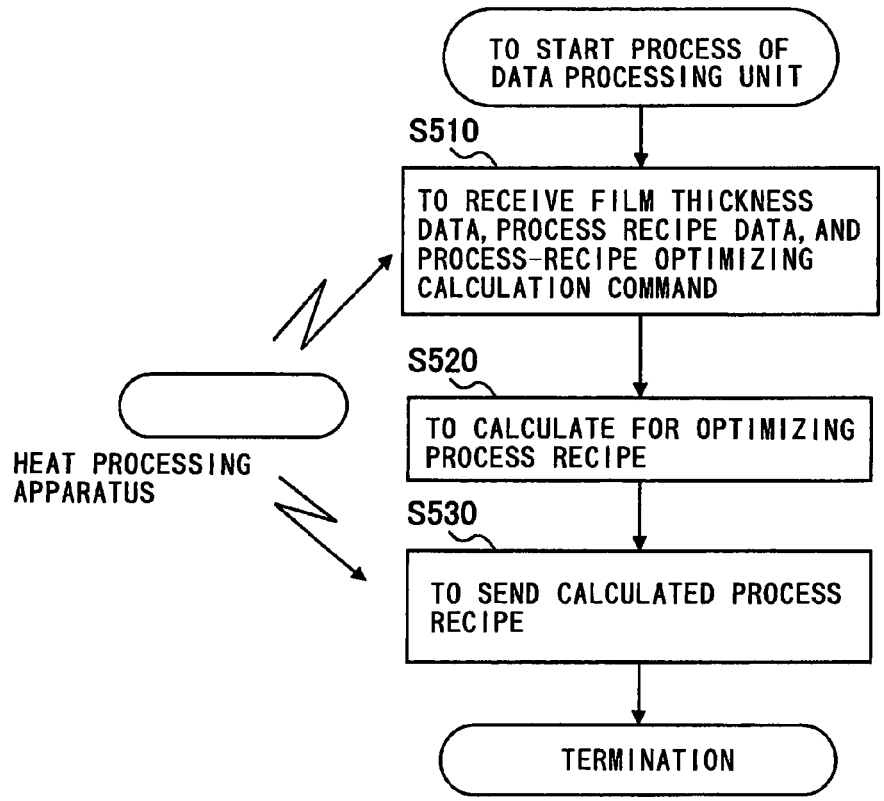
FIG. 10 is a flowchart showing a concrete example of a process executed by the data processing unit in this embodiment.

FIG. 6 is the flowchart showing a process of the host computer. FIGS. 7 to 9 are the flowcharts showing a process of the heat processing apparatus. FIG. 10 is the flowchart showing a process of the data processing unit.

A process of a wafer W by the substrate processing system 300 in this embodiment is performed in response to various commands from the host computer 500. At first, as shown in FIG. 6, the host computer 500 sends a command for conducting a wafer process to the heat processing apparatus 100 at a step S110.

In response to the wafer-process conducting command, the heat processing apparatus 100 performs a wafer process shown in FIG. 7. Namely, when the heat processing apparatus 100 receives the wafer-process conducting command from the host computer 500 at a step S210, the heat processing apparatus 100 conducts a wafer process at a step S220, depending on process conditions (a set pressure in the process chamber, a set temperature of the heater, a gas flowrate, and so on) stated in the process recipe data 272 stored in the storage means 270.

Here, there is described an operation of the heat processing apparatus 100 which performs a film deposition process of a wafer. For example, the wafer boat 114, to which an unprocessed wafer has been transferred from the cassette container, is loaded into the reaction tube 110, and the heater 130 is controlled depending on a set temperature so as to heat an inside of the reaction tube 110 to a process temperature. Then, an oxygen gas, for example, is supplied into the reaction tube 110, and a heat process (e.g., oxidation process) is performed for the wafer. Then, a surface part of a silicon film of the wafer is oxidized, so that an oxide film (silicon oxide film) as a thin film is formed on the wafer.

Thereafter, after the heat process is completed, an atmosphere inside the reaction tube 110 is changed to an inert gas atmosphere, and the temperature inside the reaction tube 110 is lowered to a predetermined temperature (e.g., 300° C.). Then, the wafer boat 114 is unloaded from the reaction tube 110, and subsequently, the processed wafer is unloaded from the wafer boat 114 and is returned to the cassette container.

Following thereto, the cassette container accommodating the processed wafer is conveyed to the film-thickness measuring apparatus 320 by, e.g., an automatic conveying robot, not shown. Then, in the film-thickness measuring apparatus 320, a thicknesses of the thin film formed on the processed wafer is measured, and the measured film thickness as film thickness data is sent to the host computer 500.

At a step S120 shown in FIG. 6, the host computer 500 receives the film thickness data of the processed wafer from the film-thickness measuring apparatus 320. Then, at a step S130, the host computer 500 calculates a deviation between the measured film thickness stated in the film thickness data and a target film thickness, and judges whether the deviation is within an allowable range or not. At the step S130, when the deviation between the measured film thickness and the target film thickness is judged to be within the allowable range, the host computer 500 judges, at a step S180, whether a process termination condition is satisfied or not. For example, when a product wafer is processed, the process termination condition may be the number of consecutively performed heat processes and/or a time period thereof, for example. Meanwhile, when an adjustment wafer is processed, for example, achievement of the target film thickness, which is described below, may be set as the process termination condition.

Further, generation of trouble in the heat processing apparatus 100 may be added to the process termination condition. In this case, at the point of the step S180, if the heat processing apparatus 100 is in trouble, the process of the host computer is terminated. For example, when a process recipe is (required to be) restored at a step S170 which is described below, there is a possibility that the heat processing apparatus 100 has some trouble. In this case, by judging that the process termination condition is satisfied at the step S180, the process of the host computer 500 can be terminated. Subsequently, a maintenance is performed on the heat processing apparatus 100 to solve the trouble. Then, similar to a process after a maintenance shown in FIG. 11 which is describe below, a process of a product wafer can be conducted, after the host computer 500 performs the process-recipe optimizing process using an adjustment wafer.

Alternatively, if the heat processing apparatus 100 runs into some trouble, the host computer 500 may receive a trouble generation signal for indicating the generation of trouble in the heat processing apparatus 100 at a step other than the step S180. Then, even in the course of the process shown in FIG. 6, upon receipt of the trouble generation signal, the process of the host computer 500 may be terminated.

On the other hand, when it is judged that the process termination condition is not satisfied at the step S180, the program returns to the step S110. Namely, the wafer process conducting command is sent to the heat processing apparatus 100. In this case, since the process recipe is not updated, the heat processing apparatus 100 conducts a process of a next wafer according to the current process recipe.

At the step S130 shown in FIG. 6, when it is judged that the deviation between the measured film thickness and the target film thickness is beyond the allowable range, a process of optimizing the process recipe (step S140 to step S170) is performed. That is, at the step S140, the host computer 500 sends, to the heat processing apparatus 100, the film thickness data and a command for conducting a process-recipe optimizing process.

In response to the command for conducting a process-recipe optimizing process, the heat processing apparatus 100 conducts a process-recipe optimizing process shown in FIG. 8. Namely, when the heat processing apparatus 100 receives, at a step S310, from the host computer 500, the film thickness data and the command for conducting a process-recipe optimizing process, the heat processing apparatus 100 sends, at a step S320, to the data processing unit 400, the film thickness data and process recipe data as data required for calculation, as well as a command for conducting a process-recipe optimizing calculation.

In response to the command for conducting a process-recipe optimizing calculation, the data processing unit 400 conducts the process-recipe optimizing calculation shown in FIG. 10. Namely, when the data processing unit 400 receives, at a step S510, from the heat processing apparatus 500, the film thickness data, the process recipe data, and the command for conducting a process-recipe optimizing calculation, the data processing unit 400 conducts the process-recipe optimizing calculation at a step S520.

A concrete example of the process-recipe optimizing calculation executed by the data processing unit 400 is described. Here, a set temperature of the heater out of the process conditions stated in the process recipe data is taken as an example of the process recipe intended to be optimized. Meanwhile, data of measured film thickness measured by the film-thickness measuring apparatus 320 is taken as an example of the film thickness data.

When a film deposition process for forming a thin film on a wafer is continuously repeated according to the same process recipe by the heat processing apparatus 100, a thickness of a thin film, which is a process result, tends to be gradually changed (changes over time), because of deterioration in properties of the heat processing apparatus 100 and status change of the inside of the process chamber 122. In addition, a thickness of a thin film, which is a process result, may be changed (shift change) due to improvement in state of the heat processing apparatus 100 by a maintenance such as exchange of parts, which is described below. Thus, by continuously repeating the film deposition process at the set temperature of the heater which has been initially set, there is generated a deviation (film thickness deviation) between a thickness of a thin film formed on a wafer and a target film thickness. Thus, it is found that the set temperature of the heater, which is initially set, is preferably adjusted to be an optimum value in accordance with changes in state inside the process chamber.

Therefore, in the process-recipe optimizing calculation in this embodiment, a deviation between the measured film thickness stated in the film thickness data and the target film thickness (film-thickness set value) is found out at first, and then, based on the deviation, the set temperature of the heater is adjusted, i.e., an optimum set temperature of the heater is calculated.

To be specific, when a process for forming an oxide film on a wafer is conducted, a set temperature of the heater is set at, e.g., 900° C., a film thickness/temperature coefficient of the oxide film (a coefficient indicating a change in a film thickness when a temperature is changed by 1° C.) is 0.12 nm (1.2 angstrom/° C.). In this case, when the measured film thickness is greater than the target film thickness (e.g., 2 nm) by 0.12 nm (1.2 angstrom), an optimum set temperature of the heater is set at 899° C. which is obtained by deducting 1° C. from the previous set temperature of the heater. In this manner, an optimum process recipe (a set temperature of the heater herein) allowing achievement of the target film thickness can be provided.

In this embodiment, the process recipe which is optimized by the optimizing calculation is a set temperature of the heater among the process conditions. Thus, it is possible to finely adjust only a set temperature of the heater by the optimizing calculation, after all the rest process conditions (a set pressure, a gas flowrate, and so on) are set. However, not necessarily limited thereto, another process condition stated in the process recipe data may be optimized by the optimizing calculation, or all the process conditions may be optimized by the optimizing calculation.

Further, the process-recipe optimizing calculation is not limited to the above calculating method, and another calculating method may be employed. For example, a relational expression between the film thickness data and the process recipe data (temperature recipe data) may be found out beforehand by using a statistic technique or the like, and the thus obtained relational expression may be stored in the storage means 460 as data for process-recipe optimizing calculation. By using the relational expression, an optimum process recipe may be calculated.

The data processing unit 400 sends, to the heat processing apparatus 100, the process recipe obtained by executing the process-recipe optimizing calculation. At a step S330 shown in FIG. 8, the heat processing apparatus 100 receives the calculated process recipe from the data processing unit 400. At a step S340, the heat processing apparatus 100 updates the current process recipe by replacing the same with the calculated process recipe. Then, the heat processing apparatus 100 sends the updated process recipe to the host computer 500.

At a step S150 shown in FIG. 6, the host computer 500 receives the updated process recipe from the heat processing apparatus 100. At a step S160, the host computer 500 judges whether the updated process recipe is acceptable or not. For example, it is judged whether a set temperature or the like included in the updated process recipe is within an allowable range or not.

When the updated process recipe is judged to be acceptable at the step S160, it is judged, at the step S180, whether the process termination condition is satisfied or not. When it is judged that the process termination condition is not satisfied at the step S180, the program returns to the step S110. Namely, the wafer process conducting command is sent to the heat processing apparatus 100. In this case, since the process recipe has been updated, the heat processing apparatus 100 conducts a process of a next wafer according to the updated process recipe.

On the other hand, when it is judged that the updated process recipe is unacceptable at the step S160, the host computer 500 sends, at a step S170, a command for restoring the process recipe to the heat processing apparatus 100.

Upon receipt of the process-recipe restoring command, the heat processing apparatus 100 performs a process-recipe restoring process as shown in FIG. 9. Namely, when the heat processing apparatus 100 receives, at a step S410, the process-recipe restoring command from the host computer 500, the heat processing apparatus 100 cancels, at a step S420, the updated process recipe, and restores the pre-updated process recipe. Thus, the next process of a next wafer is conducted according to the pre-updated process recipe.

In this manner, the host computer 500 repeats the process of a wafer and the optimizing process of the process recipe (step S110 to step S170 shown in FIG. 6). Then, when it is judged that the process termination condition is satisfied, at the step S180, a series of processes is completed.

According to the process-recipe optimizing process in this embodiment, the heat processing apparatus 100 receives a command from the host computer 500, and causes the data processing unit 400 to execute the optimizing calculation of the process recipe. Thus, the process-recipe optimizing process can be performed in response to a command from the host computer 500.

Thus, the host computer 500 can manage a target value (e.g., a target film thickness) of the wafer process. Therefore, whether to perform the process-recipe optimizing process or not can be judged by the host computer 500. In addition, the host computer 500 can freely set and control any condition, e.g., degree of deviation (allowable range) from the target value, for conducting the process-recipe optimizing process. As a result, the process recipe can be automatically optimized by a command from the host computer 500.

Further, a criterion (e.g., an allowable range of a set temperature or the like) for judging whether to accept the optimized process recipe or not can be controlled by the host computer. Thus, even when the process recipe is automatically optimized, it is possible to prevent that a wafer is automatically processed by the heat processing apparatus 100 according to an inappropriate (unintended) process recipe. In addition, due to the automated process-recipe optimizing process, it is not necessary for a user to judge whether to perform the process-recipe optimizing process or not, and whether to accept the optimized process recipe or not. Therefore, a load on the user can be alleviated.

Moreover, the process recipe obtained by the optimizing calculation can be promptly updated by the heat processing apparatus 100, and there is no necessity for the heat processing apparatus 100 to send the process recipe to the host computer 500 and wait a next command therefrom. Since the process-recipe optimizing process can be terminated at this moment, it can be prevented that the heat processing apparatus 100 awaiting a command from the host computer 500 becomes busy at the process-recipe optimizing process and thus the heat processing apparatus 100 cannot start another process.

The above process-recipe optimizing process can be applied to various operations of the substrate processing system 300. For example, immediately after activation of the substrate processing system 300, and immediately after a maintenance such as replacement of parts, the process-recipe optimizing process can be applied in order to obtain an optimum process recipe. Further, during the working of the substrate processing system 300, the process-recipe optimizing process can be applied in a feed-forward manner, after a heat process of a product wafer is finished. In this case, the process-recipe optimizing process can be applied every time a batch of wafers are heat-processed, or every time the predetermined number of batches of wafers are heat-processed.

(Example of Use of Substrate Processing System)

Figure 11:
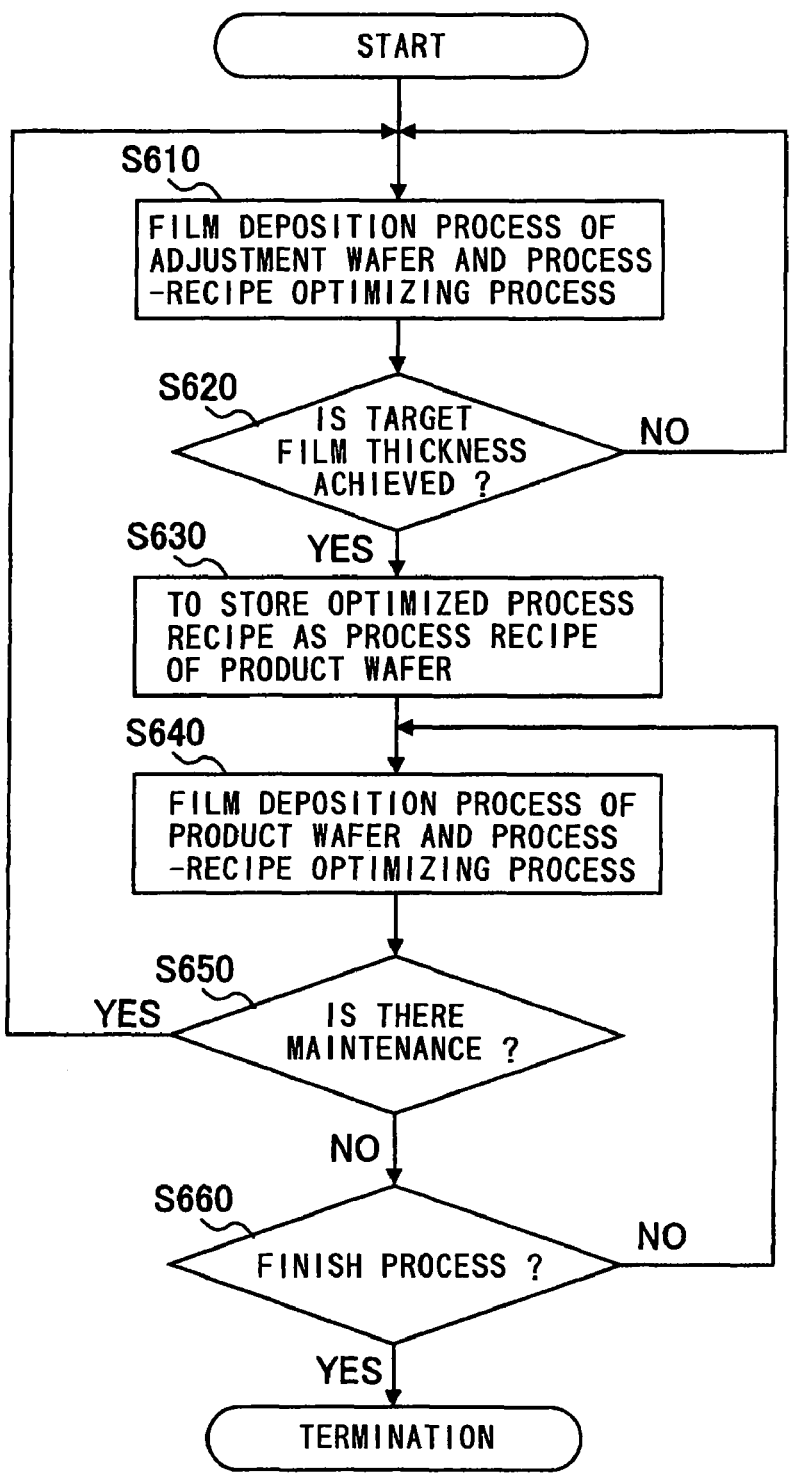
FIG. 11 is a flowchart showing an operational example of the substrate processing system in this embodiment.

Next, an example of use of the substrate processing system 300 utilizing the above-described process of a wafer and the process-recipe optimizing process will be described with reference to the drawings. Given herein as an example to describe the process is a case where a wafer is subjected to a heat process (e.g., a film deposition process) by the heat processing apparatus 100. FIG. 11 is a flowchart showing an example of use of the substrate processing system 300.

When the substrate processing system 300 is activated, at a step S610, a film deposition process is performed, in response to a command from a host computer 500, to an adjustment wafer (dummy wafer), before a product wafer is processed, according to an initial process recipe that has been set in advance. Then, based on a result of the film deposition process, the optimizing process of the process recipe is performed. To be specific, there are conducted the respective processes shown in FIGS. 6 to 10 in which the "process of wafer" is replaced with the "process of adjustment wafer".

At a step S620, it is judged by the host computer 500 whether the target film thickness has been achieved or not. Specifically, the process is conducted, under the process termination condition at the step S180 shown in FIG. 6 that the target film thickness has been achieved, i.e., a deviation between the measured film thickness and the target film thickness is within the allowable range. Until the target film thickness can be achieved, the process of the adjustment wafer and the optimization of the process recipe are repeated at the step S610. Thereafter, when it is judged that the target film thickness has been achieved at the step S620, the optimized process recipe is stored in the process recipe data 272 of the storage means 270, at a step S630, as a process recipe for a product wafer.

Then, at a step S640, in response to a command from the host computer 500, a film deposition process is performed to a product wafer according to the process recipe for a product wafer. Also at this time, the optimizing process of the process recipe is performed. To be specific, there are conducted the respective processes shown in FIGS. 6 to 10 in which the "process of wafer" is replaced with the "process of product wafer".

Then, whether there was a maintenance of the heat processing apparatus 100 or not is judged at a step S650. The host computer 500 judges whether the heat processing apparatus 100 has been maintained or not. Thus, when the heat processing apparatus 100 undergoes a maintenance such as replacement of parts, this information is sent to the host computer 500.

At the step S650, when it is judged that there was no maintenance of the heat processing apparatus 100, whether to complete the process or not is judged at a step S660. Specifically, at the step S180 shown in FIG. 6, the process is performed under the process termination condition that the number of film deposition processes reaches the predetermined number of times. Thus, until the number of film deposition processes reaches the predetermined number of times, the process of a product wafer and the optimization of the process recipe are repeated at the step S640. Therefore, the wafer can be anytime subjected to the film deposition process according to the optimized process recipe. Accordingly, as described above, even when the properties of the heat processing apparatus 100 is deteriorated or the state inside the process chamber 122 is changed, for example, the target film thickness can be unfailingly achieved owing to the correction of the process recipe.

On the other hand, when it is judged that there was a maintenance of the heat processing apparatus 100 at the step S650, the program returns to the step S610. Then, the initial process recipe is set again, the film deposition process is performed to the adjustment wafer (dummy wafers), the optimizing process of the process recipe is conducted, and the finally optimized process recipe is determined as a process recipe for a product wafer. After that, the film deposition process of a product wafer and the process-recipe optimizing process are performed at the step S630 and subsequent steps thereto. Thus, even after the state of the heat processing apparatus 100 is improved by the maintenance of the heat processing apparatus 100, the target film thickness can be unfailingly achieved by resetting an optimum process recipe.

As described above, by using the substrate processing system in this embodiment, the process recipe can be automatically optimized in response to a command from the host computer 500, not only immediately after activation of the substrate processing system but also in the course of batch process of wafers. Thus, the target film thickness can be always achieved.

Although the heat processing apparatus of a batch type is taken as an example of the substrate processing apparatus in this embodiment, the substrate processing apparatus is not necessarily limited thereto. For example, the substrate processing apparatus may be a heat processing apparatus of a wafer-fed type. Further, in addition to the film deposition process, the process may be an oxidation process, a diffusion process, and the like. Further, in addition to the film thickness data taken as an example in the above embodiment, the process data of a substrate to be processed, which is obtained as a result of the process, may be various data measurable after a wafer is processed, such as a minute size (e.g., sizes of a width and a depth of a device) of a device formed on a wafer by the etching process, an etching rate, a wafer in-plane uniformity thereof, and so on. In this case, in place of the film-thickness measuring apparatus 320 shown in FIGS. 3 and 12 described below, a measuring apparatus capable of measuring designed process data may be used.

In addition to the heat processing apparatus 100 taken as an example in the above embodiment, substrate processing apparatuses for conducting various kinds of processes, such as etching apparatuses, sputtering apparatuses, and the like may be applied to the substrate processing apparatus. In addition to the semiconductor wafer, the substrate to be processed may be an FPD (Flat Panel Display) substrate such as a liquid crystal substrate.

Although in the above embodiment, the one substrate processing apparatus 100 has been described by way of example as the substrate processing apparatus which is connected to the network 310, the present invention is not limited thereto. For example, as shown in FIG. 12, a plurality of substrate processing apparatuses 600A, 600B, 600C . . . may be connected to the network 310.

In this case, the data processing unit 400 may be structured as an advanced group controller (hereinafter referred to as "AGC"). Such a data processing unit 400 is capable of executing the process-recipe optimizing calculation for the respective substrate processing apparatuses 600A, 600B, 600C, . . . . In addition to the above process-recipe optimizing calculation function, the AGC may be structured to perform an analysis process for analyzing process data, a statistical process for statistically calculating process data, a centralized monitoring process of process data or its analyzed result or its statistically calculated result, and further a process of reflecting the analyzed result or the statistically calculated result on a recipe.

The AGC may be formed of one computer, or a plurality of computers. The AGC may be divided into a server and one or more clients so as to distribute functions.

Figure 12:
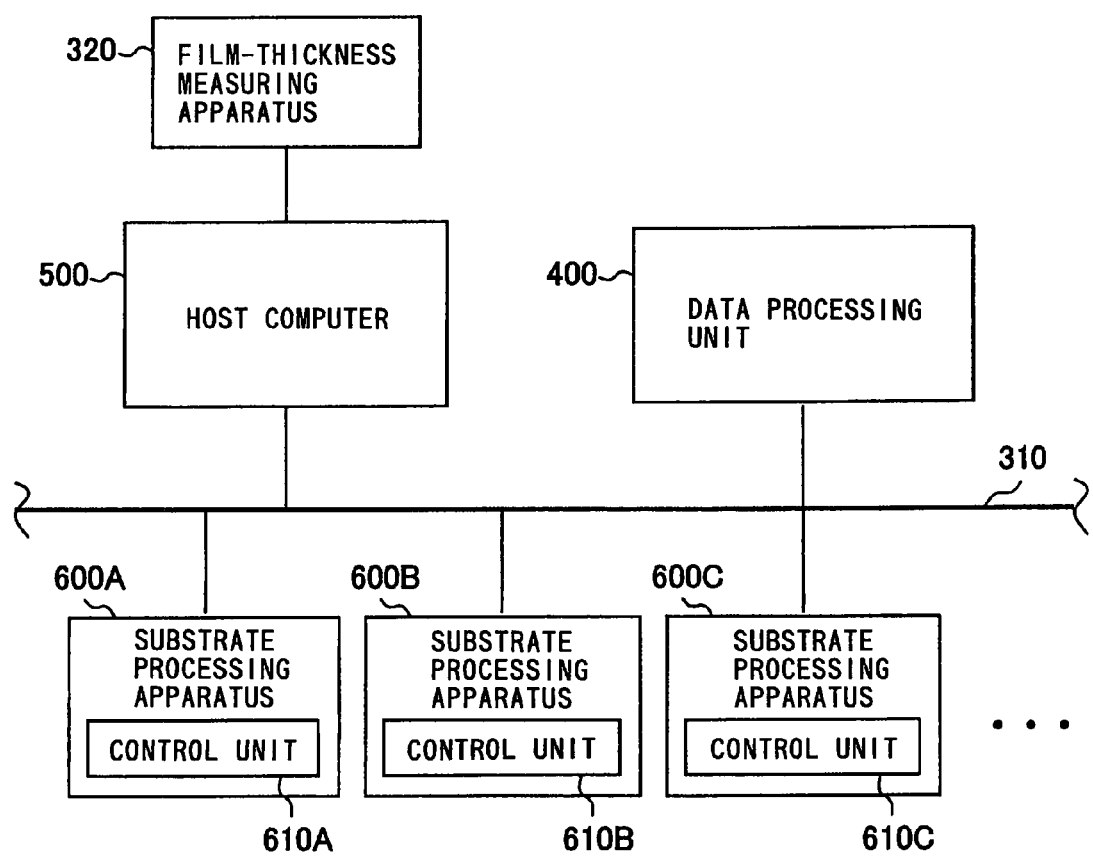
FIG. 12 is a block diagram showing an alternative structural example of the substrate processing system in this embodiment.

In the substrate processing system 300 shown in FIG. 12, control units 610A, 610B, 610C, . . . of the respective substrate processing apparatuses 600A, 600B, 600C, . . . can receive a command from the host computer 500, and cause the data processing unit 400 to execute the optimizing calculation of a process recipe. According to this, in response to a command from the host computer 500, the process-recipe optimizing processes for the respective substrate processing apparatuses 600A, 600B, 600C, . . . can be performed. Thus, a target value (e.g., a target film thickness) of a wafer process performed by each of the respective substrate processing apparatuses 600A, 600B, 600C . . . can be managed by the host computer in a unitary manner. Therefore, whether to execute the process-recipe optimizing process or not can also be collectively judged by the host computer 500.

In the structural example shown in FIG. 12, the single film-thickness measuring apparatus 320 measures film thicknesses of wafers processed by the respective substrate processing apparatuses 600A, 600B, 600C, . . . . However, not limited to this example, a plurality of film-thickness measuring apparatuses may be connected to the respective substrate processing apparatuses 600A, 600B, 600C, . . . to independently measure film thicknesses of wafers processed by the respective substrate processing apparatuses 600A, 600B, 600C, . . . , for example. In this case, film thickness data form the respective film-thickness measuring apparatuses may be imported into the respective substrate processing apparatuses 600A, 600B, 600C, . . . , and may be sent therefrom to the host computer 500 through a network 310.

The present invention, which has been described in detail in terms of the above embodiment, may be applied to a system formed by a plurality of equipments, or may be applied to an apparatus formed of a single equipment.

In addition, the present invention may be generally carried out by supplying, to a system or an apparatus, a medium such as a storage medium storing a program of a software capable of realizing a function of the above embodiment, to allow a computer (or a CPU and an MPU) included in the system or the apparatus to read and execute the program stored in the medium such as a storage medium.

In this case, it can be said that the program itself, which is read out from the medium such as a storage medium, fulfills the function of the above embodiment. Therefore, the medium such as a storage medium storing the program should be understood as a statutory subject matter of this patent application. The medium such as a storage medium for supplying the program includes, for example, a flexible disc, a hard disc, an optical disc, a magneto optic disc, a CD-ROM, a CD-R, a CD-RW, a DVD-ROM, a DVD-RAM, a DVD-RW, a DVD+RW, a magnet tape, a nonvolatile memory card, and a ROM. It is possible to download the program in a medium such as a storage medium to provide thereto the program through a network.

The present invention is not limited to a case in which the function of the above embodiment is fulfilled by executing only the program read out by the computer. The function of the above embodiment may be fulfilled in a case in which, in response to a command from the program, another program such as an OS operated in the computer performs a part of or all the actual processes, i.e., the program read out by the computer cooperates with the other program. This case should be also understood as a statutory subject matter of this patent application.

Further, a program read out from a medium such as a storage medium may be written in a function expansion board inserted in a computer or a memory provided in a function extension unit connected to a computer, and thereafter, in response to a command of the program, a CPU provided in the function expansion board or the function expansion unit may perform a part of or all the actual processes, i.e., the program may cooperate with the CPU, so as to fulfill the function of the above embodiment. This case should be also understood as a statutory subject matter of this patent application.

Although the preferred embodiment of the present invention has been described with reference to the attached drawings, it goes without saying that the present invention is not limited to this embodiment. It is apparent for those skilled in the art that various changes and modifications are obvious within the scope of the invention recited in the claims. It should be naturally understood that these changes and modifications belong to the scope of the invention.

The invention claimed is:

1. A method of optimizing a process recipe of a substrate processing system, that includes: a substrate processing apparatus that performs a process for a substrate to be processed according to a process recipe, a data processing unit that executes a calculation for optimizing the process recipe, and a host computer, the substrate processing apparatus, the data processing unit, and the host computer being connected to each other through a network, the method comprising the steps of:

sending a command for conducting a process-recipe optimizing process from the host computer to the substrate processing apparatus, when a predetermined condition is satisfied;

sending required data from the substrate processing apparatus to the data processing unit in response to the command for conducting a process-recipe optimizing process from the host computer to cause the data processing unit to execute a process-recipe optimizing calculation to calculate an optimum process recipe, and updating the process recipe in the substrate processing apparatus based on the calculated optimum process recipe;

sending the updated process recipe from the substrate processing apparatus to the host computer when the process recipe is updated; and judging whether the updated process recipe is acceptable or not by the host computer such that when the updated process recipe is judged to be acceptable, a next command for processing the substrate is sent to the substrate processing apparatus, and when the updated process recipe is judged to be unacceptable, a command for restoring the process recipe is sent to the substrate processing apparatus to return the process recipe to the pre-updated process recipe.

2. A method of optimizing a process recipe of a substrate processing system, that includes: a substrate processing apparatus that performs a film deposition process for a substrate to be processed according to a process recipe, a data processing unit that executes a calculation for optimizing the process recipe, and a host computer, the substrate processing apparatus, the data processing unit, and the host computer being connected to each other through a network, the method comprising the steps of:

measuring a film thickness of the substrate to be processed that has been subjected to a film deposition process by the substrate processing apparatus;

sending a command for conducting a process-recipe optimizing process from the host computer to the substrate processing apparatus when the measured film thickness deviates from a target film thickness and the deviation is beyond an allowable range;

sending required data from the substrate processing apparatus to the data processing unit in response to the command for conducting a process-recipe optimizing process from the host computer to cause the data processing unit to execute a process-recipe optimizing calculation to calculate an optimum process recipe for achievement of the target film thickness, and updating the process recipe in the substrate processing apparatus based on the calculated optimum process recipe;

sending the updated process recipe from the substrate processing apparatus to the host computer when the process recipe is updated; and judging whether the updated process recipe is acceptable or not by the host computer such that when the updated process recipe is judged to be acceptable, a next command for processing a substrate is sent to the substrate processing apparatus, and when the updated process recipe is judged to be unacceptable, a command for restoring the process recipe is sent to the substrate processing apparatus to return the process recipe to the pre-updated process recipe.

3. The method of optimizing a process recipe of a substrate processing system according to claim 2, wherein
the step of measuring a film thickness of the substrate to be processed is performed by a film-thickness measuring apparatus connected to the host computer.

4. The method of optimizing a process recipe of a substrate processing system according to claim 2, wherein
the step of measuring a film thickness of the substrate to be processed is performed by a film-thickness measuring apparatus connected to the substrate processing system.

5. A substrate processing system, comprising:
a substrate processing apparatus that performs a process for a substrate to be processed according to a process recipe;
a data processing unit that executes a calculation for optimizing the process recipe; and
a host computer, wherein
the substrate processing apparatus, the data processing unit, and the host computer are connected to each other through a network;
the host computer acquires process data of the substrate to be processed that has been processed by the substrate processing apparatus, judges whether a process recipe is to be optimized or not based on the process data, and sends a command for conducting a process-recipe optimizing process to the substrate processing apparatus when the process recipe is judged to be optimized;

upon receipt of the command for conducting a process-recipe optimizing process from the host computer, the substrate processing apparatus sends required data to the data processing unit to make the data processing unit execute the process-recipe optimizing calculation to calculate an optimum process recipe, and updates the process recipe based on the calculated optimum process recipe;

the substrate processing apparatus sends the updated process recipe to the host computer when the process recipe is updated, upon receipt of the updated process recipe from the substrate processing apparatus, the host computer judges whether the updated process recipe is acceptable or not before sending a next command for processing the substrate to be processed to the substrate processing apparatus; and when the updated process recipe is judged to be acceptable, the host computer sends the next command to the substrate processing apparatus for processing the substrate, and when the updated process recipe is judged to be unacceptable, the host computer sends a command for restoring the process recipe to the substrate processing apparatus to return the process recipe to the pre-updated process recipe.

* * * * *